(12) United States Patent
Turner et al.

(10) Patent No.: US 6,833,058 B1
(45) Date of Patent: Dec. 21, 2004

(54) TITANIUM-BASED AND ZIRCONIUM-BASED MIXED MATERIALS AND SPUTTERING TARGETS

(75) Inventors: Stephen P. Turner, Moon, PA (US); Joseph E. Green, Cranberry Township, PA (US); Rodney L. Scagline, Evans City, PA (US); Yun Xu, Pittsburgh, PA (US)

(73) Assignee: Honeywell International Inc., Morristown, NJ (US)

( * ) Notice: Subject to any disclaimer, the term of this patent is extended or adjusted under 35 U.S.C. 154(b) by 403 days.

(21) Appl. No.: 09/695,814

(22) Filed: Oct. 24, 2000

(51) Int. Cl.⁷ .............................................. C23C 14/34
(52) U.S. Cl. ........................ 204/298.13; 204/298.12; 420/417; 420/422
(58) Field of Search ................... 204/298.12, 298.13; 420/417, 422

(56) References Cited

U.S. PATENT DOCUMENTS

| | | | |
|---|---|---|---|
| 2,949,357 A | 8/1960 | Resnick | 148/421 |
| 4,830,665 A | 5/1989 | Winand | 175/10.19 |
| 4,895,770 A * | 1/1990 | Schintlmeister et al. | 428/552 |
| 4,903,117 A | 2/1990 | Okamoto et al. | 257/751 |
| 5,110,543 A | 5/1992 | Ando et al. | 428/34 |
| 5,171,379 A | 12/1992 | Kumar et al. | 148/422 |
| 5,209,835 A * | 5/1993 | Makino et al. | 204/192.16 |
| 5,372,659 A | 12/1994 | Lamaze et al. | 148/421 |
| 5,403,458 A * | 4/1995 | Hartig et al. | 204/192.15 |
| 5,939,788 A | 8/1999 | McTeer | 257/751 |
| 6,024,847 A | 2/2000 | Rosenberg et al. | 204/243.1 |
| 6,210,634 B1 | 4/2001 | Ishigami et al. | 420/417 |
| 6,396,207 B1 * | 5/2002 | Hasegawa et al. | 313/495 |
| 6,417,105 B1 | 7/2002 | Shah et al. | 438/682 |
| 6,451,402 B1 | 9/2002 | Nee | 428/64.1 |
| 2002/0041819 A1 | 4/2002 | Kumar et al. | 416/66 |

FOREIGN PATENT DOCUMENTS

| | | |
|---|---|---|
| AU | 252442 | 9/1960 |
| EP | 0 442 752 A1 | 8/1991 |
| EP | 0872572 A1 | 10/1998 |
| EP | 0 928 977 A1 | 7/1999 |
| FR | 2 585 730 A1 | 1/1985 |
| GB | 8105333 | 3/1959 |
| GB | 2 202 237 A | 9/1988 |
| JP | 1092338 | 4/1969 |
| JP | 55-179784 | 12/1980 |
| JP | 56-71955 | 6/1981 |
| JP | 57019372 | 2/1982 |
| JP | 61031992 A | 2/1986 |
| JP | 02-173222 | 7/1990 |
| JP | 05097408 | 4/1993 |
| JP | 5-255843 * | 10/1993 ........... 204/298.13 |
| JP | 08255912 * | 1/1996 |
| JP | 08120445 | 5/1996 |
| JP | 09-025562 | 1/1997 |
| JP | 11074348 | 3/1999 |
| JP | 2000012539 | 1/2000 |
| JP | 200273623 | 10/2000 |
| SU | 1582683 | 9/1996 |
| WO | WO 98/49357 | 11/1998 |
| WO | WO 00/13235 | 3/2000 |
| WO | WO 02/00959 A1 | 1/2002 |

OTHER PUBLICATIONS

Machine translation of Yasunori Japanese 08–255912.*
Knotck et al., "The Structure and Composition of Ti–Zr–N, Ti–Al–Zr–N and Ti–Al–V–N Coatings" Materials Science and Engineering, A105/106, Dec. 1988, pp. 481–488.

(List continued on next page.)

*Primary Examiner*—Rodney G. McDonald
(74) *Attorney, Agent, or Firm*—Wells St. John P.S.

(57) ABSTRACT

The invention encompasses methods of forming titanium-based mixed-metal materials and zirconium-based mixed-metal materials utilizing one or more of a reduction process, electrolysis process and iodide process. The invention also encompasses a sputtering target comprising zirconium and one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, Ti, V, W, Y, and Yb. The invention also encompasses a sputtering target comprising titanium and boron.

11 Claims, 4 Drawing Sheets

OTHER PUBLICATIONS

Sakamoto et al., "Preparation and Microstructure of Reactively Sputtered $Ti_{1-x}Zr_xN$ Films" Thin Solid Films 228, May 1993, pp. 169–172.

Hughes et al., "Grain Subdivision and the Development of Local Orientations in Rolled Tantalum" Tantalum. The Minerals, Metals & Materials Society, 1996, pp. 257–262. (Year is sufficiently early so that the month is not an issue.)

Arlt, Jr., "Sulfonation and Sulfonation to Thorium and Thorium Compounds" Kirk–Othmer Encyclopedia of chemical Technology vol. 22, pp. 541–564. (1993, Year is sufficiently early so that the month is not an issue).

Kirkbride et al., "The Effect of Yitrium on the Recrystallization and Grain Growth of Tantalum", J. Less–Common Metals, vol. 9, pp. 393–408, 1965. (Year is sufficiently early so that the month is not an issue.)

National Research Corporation Press Release, pp. 1–4, Jul. 1964.

National Research Corporation Data Sheet "SGS Tatalum", pp. 1–7, no date.

ASTM Standard Specification for Tantalum and Tantalum Alloy Plate, Sheet, and Strip, pp. 558–561, 1992. (Year s sufficiently early so that the month is not an issue.)

Kumar, et al. "Effect of Intermetallic Compounds of the Properties of Tantalum" Materials Research Society Symposium Proceedings, vol. 322, pp. 413–422, 1994. (Year is sufficiently early so that the month is not an issue.)

Kumar, et al. "Effect of Intermetallic Compounds of the Properties of Tantalum" Refractory Metals & Hard Materials, vol. 12, pp. 35–40. 1994. (Year is sufficiently early so that the month is not an issue.)

Klein et al., "Inhomogeneous Textures in Tantalum Sheets" Materials Science Forum, vol. 157–162, pp. 1423, (1994). (Year is sufficiently early so that the month is not an issue.)

Clark et al., "Influence of Transverse Rolling on the Microstructrual and Texture Development in Pure Tantalum", Metallurgical Transactions, vol. 23A, pp. 2183–2191, Aug. 1992.

Raabe, et al., "Texture and Microstructure of Rolled and Annealed Tantalum", Materials Science and Technology, vol. 10, pp. 299–305, Apr. 1994.

Wright et al., "Texture Gradient Effects in Tantalum", International Conference on Textures of Materials, 7 pgs., Sep. 1993.

Wright et al., "Textural and Microstructural Gradient Effects on the Mechanical Behavior of a Tantalum Plate", Methallurgical Transactions A. 25A (1994), pp. 1–17. (Year is sufficiently early so that the month is not an issue.)

Clark et al., "Effect of Processing Variables on Texture and Texture Gradients in Tantalum", Metallurgical Transactions A. vol. 22A, Sep. 1991, pp. 2039–2047.

Kumar et al., "Corrosion Resistant Properties of Tantalum" Corrosion 95, Paper No. 253, 14 pages. (No date).

U.S. Appl. No. 60/225,518, filed Aug. 2000, Li et al.

U.S. Appl. No. 60/225,518, Taylor et al., filed Aug. 15, 2000.

* cited by examiner

TITANIUM-BASED AND ZIRCONIUM-BASED MIXED MATERIALS AND SPUTTERING TARGETS

TECHNICAL FIELD

The invention pertains to methods of forming titanium-based mixed-metal materials and zirconium-based mixed-metal materials. The invention also pertains to sputtering targets, and in particular applications pertains to zirconium-containing sputtering targets and/or titanium-containing sputtering targets.

BACKGROUND OF THE INVENTION

There are numerous applications in which it can be desired to form mixed-metal products. For purposes of interpreting this disclosure and the claims that follow, the terms "alloy" and "mixed-metal product" are both defined to pertain to compositions having at least two elements present to amounts greater than or equal to the sum of any metallic impurities. For example, a material that is 4N5 pure (i.e., 99.995% pure) has a total of all metallic impurities of 50 ppm or less. A 4N5 alloy (or mixed-metal product) of Ti and Zr is defined herein to comprise both Ti and Zr in amounts greater than or equal to 50 ppm. Typically, one of the Ti and Zr would be present in much higher concentration than the other, but regardless, both would be present in concentrations greater than that of the total metallic impurities. Other exemplary mixed-metal materials are a 3N5 mixed-metal material, which, in accordance with the definition herein comprises at least two elements that are each present to a concentration in excess of 500 ppm; and a 5N5 mixed-metal material, which, in accordance with the definition herein comprises at least two elements which are each present to a concentration in excess of 5 ppm. The percentages and concentrations referred to herein are weight percentages and concentrations, except, of course, for any concentrations and percentages specifically indicated to be other than weight percentages or concentrations.

Among the applications for which it can be desired to form a mixed-metal product or alloy are applications in which it is desired to form ingots of high purity alloys. It can be desired to form ingots of high purity alloys to enable formation of sputtering targets (also referred to as physical vapor deposition targets) from the ingots. The sputtering targets will have uniform distribution of alloys throughout as a result of being formed from ingots consisting of a uniform composition of high purity alloys.

Typically, alloys are made by either adding elemental alloy components to a molten pool of bulk metal, or by pre-mixing and blending various melt feedstock materials with one another before actually melting the materials together. A limitation of the above-described processes is that the processes do not lend themselves to a batch melting process in that at no time is the whole of an ingot material simultaneously molten. Because of this, several consecutive melting operations must be performed in order to form a uniform refractory metal alloy. Without multiple melting operations, variations in chemical composition form in a resulting ingot material. Such variations in chemical composition can lead to problems in structures formed from the ingot materials. For instance, if sputtering targets are formed from the ingot materials, the sputtering targets can have non-uniform chemical compositions reflecting the non-uniform chemical composition within the ingot. If the sputtering targets are utilized in semiconductor fabrication, material will be sputtered from the targets to deposit a film on a semiconductive substrate. Ideally, the film will be homogeneous and uniform across the material. However, variations in chemical composition and homogeneity within a sputtering target can translate into variations in composition and homogeneity of a deposited film, and reduce quality of devices comprising the film.

For the above-discussed reasons, it is desired to develop methodology for forming ingots having uniform and homogeneous composition throughout.

Another aspect of the prior art is that integrated circuit interconnect technology is changing from aluminum subtractive processes to copper dual damascene processes. The shift from aluminum to copper is causing new barrier layer materials to be developed. Specifically, titanium nitride (TiN) films had been utilized as barrier layers in the aluminum technologies to inhibit aluminum atoms from diffusing into adjacent dielectric materials and causing device failure. The TiN films can be formed by, for example, reactively sputtering a titanium target in a nitrogen atmosphere. The TiN films are found to be poor barrier layers relative to copper because the diffusivity of copper atoms through TiN films is too high.

Another problem that can occur in attempting to utilize titanium materials as barrier layers can occur in attempting to adhere titanium materials to dielectric materials. Specifically, it is often found that titanium materials adhere poorly to commonly used dielectric materials (such as, for example, silicon dioxide), and that circuit defects can be caused by such poor adhesion.

In an effort to avoid the problems associated with titanium, there has been development of non-titanium barrier materials for diffusion layers. Among the materials which have been developed is tantalum nitride (TaN). It is found that TaN can have a close to nanometer-sized grain structure and good chemical stability as a barrier layer for preventing copper diffusion. However, a difficulty associated with TaN is that the high cost of tantalum can make it difficult to economically incorporate TaN layers into semiconductor fabrication processes.

Titanium can be a lower cost material than tantalum. Accordingly, it could be possible to reduce materials cost for the microelectronics industry relative to utilization of copper interconnect technology if methodology could be developed for utilizing titanium-comprising materials, instead of tantalum-comprising materials, as barrier layers for inhibiting copper diffusion. It is therefore desirable to develop new titanium-containing materials which are suitable as barrier layers for impeding or preventing copper diffusion, and to develop methodology for forming sputtering targets comprising the new materials.

In addition to the desirability of developing new titanium-containing materials which are suitable as barrier layers, it would also be desirable to develop other materials suitable as barrier layers and having either lower cost or better properties than the tantalum materials presently being utilized. Further, it would be desirable to develop methodology for forming sputtering targets comprising such other materials.

SUMMARY OF THE INVENTION

In one aspect, the invention encompasses a method of forming a titanium-based or zirconium-based mixed-metal material. For purposes of interpreting this disclosure and the claims that follow, a "titanium-based" material is defined as a material in which titanium is a majority element, and a "zirconium-based" material is defined as a material in which zirconium is a majority element. A "majority element" is defined as an element which is present in larger concentration than any other element of a material. A majority element can be a predominate element of a material, but can also be present as less than 50% of a material. For instance, titanium can be a majority element of a material in which the titanium is present to only 30%, provided that no other element is present in the material to a concentration of greater than or equal to 30%. In an exemplary process of forming a titanium-based mixed-metal ingot, such ingot can be formed by combining a mixture of titanium halide and at least one other metal halide with a reducing agent to produce a mixed-metal product. The mixed-metal product is then melted to form a molten mixed-metal material. The molten mixed-metal material is cooled into a mixed-metal ingot. The ingot comprises titanium and at least one other metal. The titanium is the majority element of the ingot, the ingot has a purity of titanium and the at least one other metal of at least 99.95%. The method can be utilized for forming a zirconium-based material by substituting zirconium halide for the titanium halide.

In another aspect, the invention encompasses a method of electrolytically forming a titanium-based mixed-metal material. A mixture of titanium and at least one other metal is electrically deposited as a mixed-metal product. The mixed-metal product is melted to form a molten mixed-metal material. The molten mixed-metal material can be cooled into a mixed-metal ingot. The ingot comprises the titanium and the at least one other metal. The titanium is the majority element of the ingot, and the ingot has a purity of titanium and the at least one other metal of at least 99.95%. The method can be utilized for electrolytically forming a zirconium-based mixed-metal ingot by substituting zirconium for the titanium.

In another aspect, the invention encompasses an iodide transfer method of forming a titanium or zirconium-based mixed-metal material. A mixture comprising either titanium or zirconium is provided in a reaction apparatus with iodine gas and a heated substrate. The titanium or zirconium is reacted with the iodine gas to form an iodide which is subsequently transferred to the heated substrate. Heat from the substrate is utilized to decompose the iodide and produce a mixed-metal product comprising the titanium or zirconium. The mixed-metal product can be melted to form a molten mixed-metal material which can then be cooled into a mixed-metal ingot.

In yet another aspect, the invention encompasses a sputtering target comprising zirconium and one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, Ti, V, W, Y, and Yb.

In yet another aspect, the invention encompasses a sputtering target comprising titanium and boron.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention includes new methods for forming mixed-metal materials, and in particular applications encompasses new methods of forming ingots comprising mixtures of metals. In particular embodiments, a mixed-metal feedstock is produced by one or more of a reduction process, electrolysis process or iodide process, and such feedstock is subsequently melted to form a homogeneous molten mixture of the metals. The molten mixture is then cooled to form a mixed-metal ingot, with the metals being homogeneously mixed throughout the ingot as, for example, an alloy composition. The ingot can be subsequently utilized to form materials in which homogeneous mixed-metal compositions are desired. For instance, the ingot can be utilized in forming sputtering targets. It is noted that various reduction processes, electrolysis processes and iodide processes have been described previously in U.S. Pat. Nos. 6,063,254, and 6,024,847; and in U.S. patent application Ser. No. 08/994,733. U.S. Pat. Nos. 6,063,254, and 6,024,847, and U.S. patent application Ser. No. 08/994,733 are all incorporated herein by reference.

In particular applications, the mixed-metals provided within the ingot will be titanium-based materials (i.e. titanium will be a majority element within the metals), and in other applications the mixed-metals will be zirconium-based mixtures (i.e. zirconium will be a majority element within the metals). Either titanium-based mixtures or zirconium-based mixtures can ultimately be utilized in forming sputtering targets. A use for a titanium-based sputtering target or a zirconium-based sputtering target can be for sputter-deposition of a titanium-based or zirconium-based film on a semiconductor substrate. Either a titanium-based film or a zirconium-based film can be utilized as a barrier layer to impede copper migration from copper-containing components to other components associated with the semiconductor substrate. Specifically, the film can be provided between a copper-containing component and other components of a semiconductor substrate, and can be utilized to prevent copper migration from the copper-containing component to the other component associated with the substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive structures described above. An exemplary semiconductive material is silicon, such as, for example, monocrystalline silicon. Among the titanium-based barrier layers that can be particular useful are layers comprising, consisting essentially of, or consisting of titanium and one or both of Zr and Hf; and such layers can be formed from sputtering targets comprising, consisting essentially of, or consisting of titanium and one or both of Zr and Hf. Among the zirconium-based barrier layers that can be particular useful are layers comprising, consisting essentially of, or consisting of zirconium and one or both of Ti and Hf; and such layers can be formed from sputtering targets comprising, consisting essentially of, or consisting of zirconium and one or both of Ti and Hf.

Figure 1:
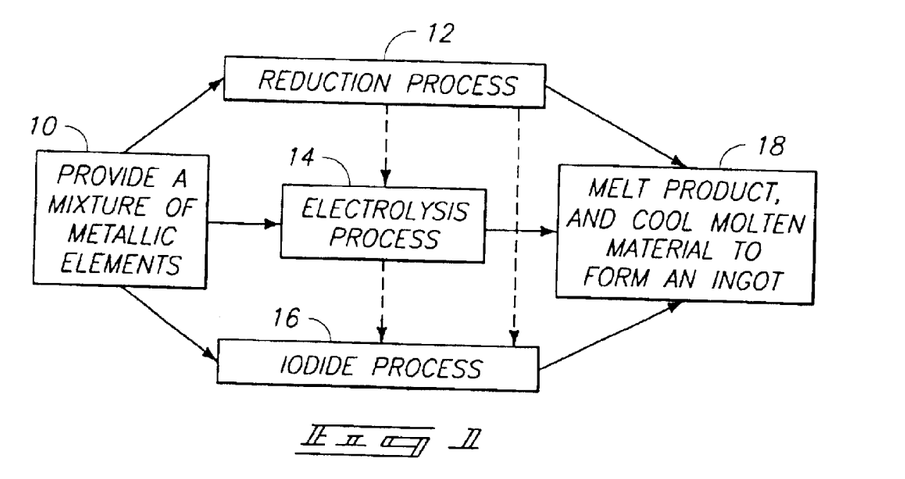
FIG. 1 is a flow-chart diagram illustrating methodology encompassed by the present invention.

A method encompassed by the present invention is shown in the flow chart of FIG. 1. At an initial step 10, a mixture of metallic elements is provided. The mixture will typically comprise titanium or zirconium, and in particular embodiments can comprise both titanium and zirconium. The elements can be in an elemental form in the mixture of step 10, or can be provided as molecular components. For instance, titanium can be provided as, for example, elemental Ti or $TiCl_4$.

The mixture of step 10 is provided to one or more of a reduction process 12, an electrolysis process 14, or an iodide process 16. In the diagram of FIG. 1, the reduction process 12 is shown connected through a dashed arrow to electrolysis process 14, which in turn is shown connected through a dashed arrow to iodide process 16. The dashed arrows show that the processes 12, 14 and 16 can be optionally conducted sequentially relative to one another. For instance, a material from step 10 can be provided to reduction process 12, and then subsequently provided from reduction process 12 to electrolysis process 14, and subsequently provided from electrolysis process 14 to iodide process 16. Alternatively, the material from step 10 can be provided to reduction process 12, and then not submitted to either electrolysis process 14 or iodide process 16. Further, although the arrows between processes 12, 14 and 16 are shown proceeding in particular directions, it is to be understood that the processes connected by the dashed arrows can be connected in reverse to the shown methodology. For instance, material from electrolysis process 14 can be provided to reduction process 12, rather than the shown flow proceeding from reduction process 12 to electrolysis process 14. However, the shown flow can be a preferred flow orientation, in that the electrolysis process is generally considered to be a process for further purification of material after a reduction process, and the iodide process is considered to be a process which can lead to additional purification beyond that accomplished by either electrolysis process 14 or reduction process 12.

After the flow of material through one or more of processes 12, 14 and 16, the material is considered a product. The product is subjected to the processing of step 18, which comprises melting the product, and subsequently cooling the molten material to form an ingot. The ingot will have a mixture of elements contained therein, with such mixture reflecting at least some of the original mixture of metallic elements utilized in the composition of step 10. However, the final composition formed in the ingot of step 18 may have a different stoichiometric relationship of component elements than the mixture of step 10, as the kinetics and/or thermodynamics of processes 12, 14 and 16 may favor one metallic material relative to another.

Figure 2:
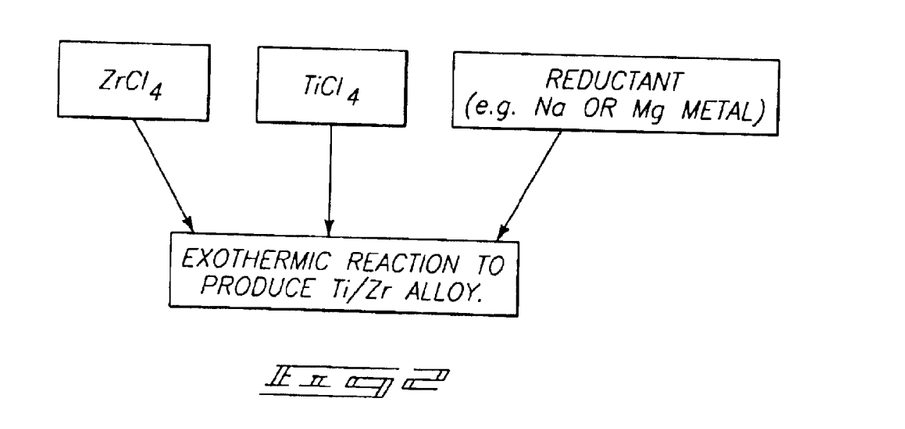
FIG. 2 is a flow-chart diagram illustrating an exemplary reduction process of the present invention.

The processes of steps 12, 14, 16 and 18 are described in more detail in FIGS. 2–6. Referring initially to FIG. 2, the reduction process of step 12 is further illustrated. The shown process forms a mixed-metal material consisting essentially of, or consisting of, a titanium/zirconium alloy. Initially, zirconium tetrachloride ($ZrCl_4$), titanium tetrachloride ($TiCl_4$), and a reductant (for example, sodium or magnesium metal) are mixed. A resulting exothermic reaction produces an alloy of titanium and zirconium. The relative proportions of titanium and zirconium within the alloy are approximately proportional to the proportions of zirconium tetrachloride and titanium tetrachloride. Accordingly, a titanium-based alloy can be formed by utilizing a higher proportion of titanium tetrachloride relative to zirconium tetrachloride, and a zirconium-based alloy can be formed by utilizing a higher percentage of zirconium tetrachloride relative to titanium tetrachloride. Although the invention is described with reference to an embodiment utilizing metal chloride reactants, it is to be understood that other metal halides can be utilized in addition to, or alternatively to, the metal chlorides.

The reactants utilized in the reduction process of FIG. 2 will typically be in a gaseous or liquid form. For instance, the reductant can comprise molten sodium and the zirconium tetrachloride and titanium tetrachloride can be in gaseous form. Accordingly, the reactions occurring in the reduction process can be summarized as reactions (1) and (2) below, in which s=solid phase; l=liquid phase and g=gas phase.

$$4Na(l)+TiCl_4(g) \rightarrow Ti(s)+4NaCl(l) \tag{1}$$

$$4Na(l)+ZrCl_4(g) \rightarrow Zr(s)+4NaCl(l) \tag{2}$$

The Ti(s) and Zr(s) can form a mixed-metal sponge. Such sponge can be subsequently melted and cooled to form an ingot, or can be utilized as a feedstock in either the electrolytic process 14 of FIG. 1 or the iodide process 16 of FIG. 1.

Although the reduction process is illustrated in FIG. 2 as being a process for forming an alloy consisting of titanium and zirconium, it is to be understood that the reduction process can form other metal materials. For instance, one or more metals selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, V, W, Y, Yb and Zr, can be utilized in combination with the titanium to form an alloy. More specifically, chlorides (or other halides) of the listed elements can be utilized in combination with titanium tetrachloride to form alloys in the reduction process. Alternatively, one or more elements from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, Ti, V, W, Y, and Yb can be utilized in combination with the zirconium to form an alloy.

If the formed alloy is a titanium-based alloy, then the total non-titanium metal content of a material produced by the process of FIG. 1 can be in a range of from 0.001% to 50%, such as, for example, a range of from 0.001% to 10%. In particular embodiments, the total non-titanium metal content of the material will be at least 0.01%, in further embodiments will be at least 0.1%, in yet other embodiments will be at least 1%, and in yet other embodiments will be at least 2%. The amount of at least one non-titanium metal in the mixed-metal material will be provided to a sufficient concentration in the material to be present to greater than 5 ppm in a material pure to 5N5, greater 50 ppm in a material pure to 4N5, greater than 500 ppm in a material pure to 3N5, or greater than one part per thousand in a material pure to 3N.

If the mixed-metal material is subsequently melted and utilized to form an ingot as shown in step 18 of the FIG. 1 process, and if such melting occurs without intervening processes occurring between the reduction process and the melting process, the relative proportion of non-titanium metals in a formed ingot will be the same as that of the mixed-metal product formed by the reduction process of FIG. 2.

If the formed alloy is a zirconium-based alloy, then the total non-zirconium metal content of a material produced by the process of FIG. 1 can be in a range of from 0.001% to 50%, such as, for example, a range of from 0.001% to 10%. In particular embodiments, the total non-zirconium metal content of the material will be at least 0.01%, in further embodiments will be at least 0.1%, in yet other embodiments will be at least 1%, and in yet other embodiments will be at least 2%. The amount of at least one non-zirconium metal in the mixed-metal material will be provided to a sufficient concentration in the material to present to greater than 5 ppm in a material pure to 5N5, greater 50 ppm in a material pure to 4N5, greater than 500 ppm in a material pure to 3N5, or greater than one part per thousand in a material pure to 3N.

In particular embodiments, the reduction process of FIG. 2 can be utilized to form an alloy consisting of titanium and zirconium, as shown. In such processes, the material can be titanium-based, with the only other metal besides titanium being zirconium; or can be zirconium-based, with the only other metal besides zirconium being titanium.

Figure 3:
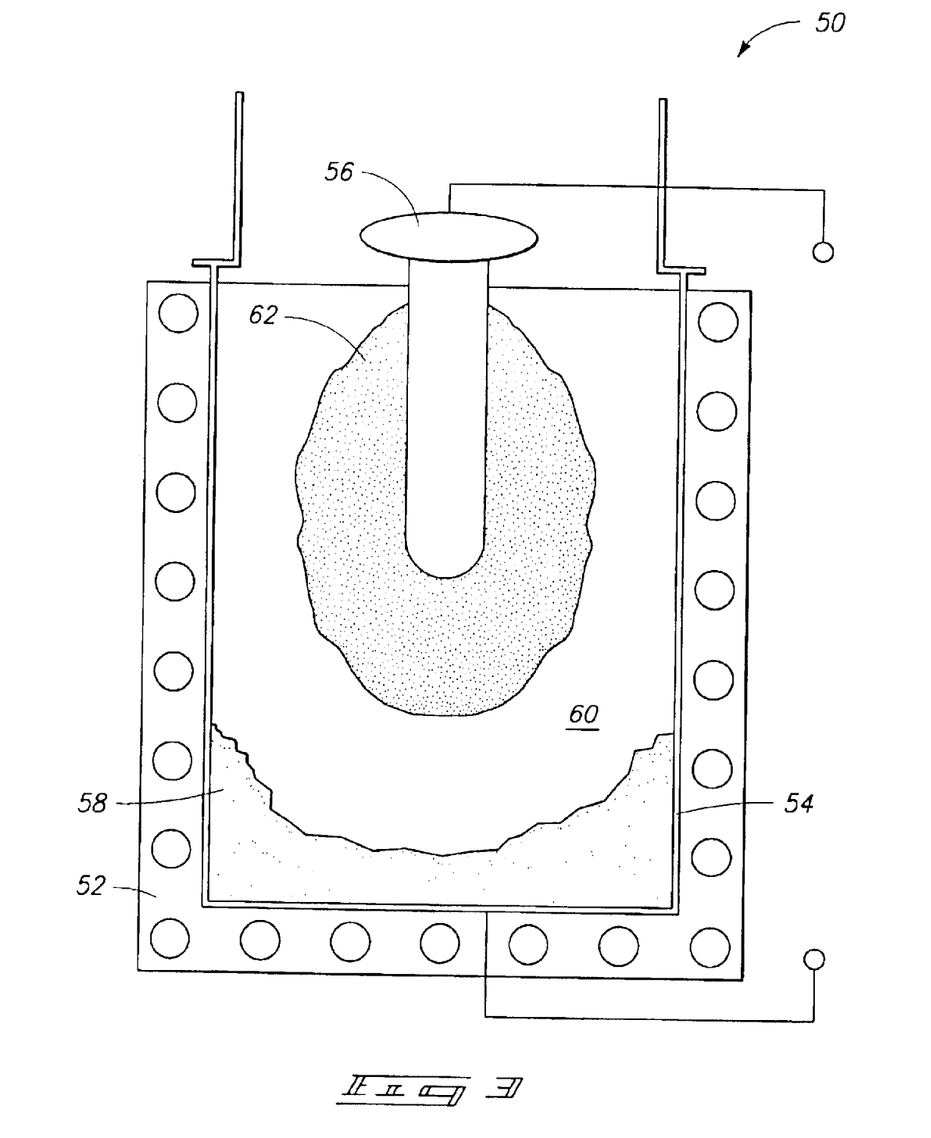
FIG. 3 is a diagrammatic, cross-sectional view of an apparatus utilized in an electrolytic process of the present invention.

Referring next to FIG. 3, the electrolysis process 14 of FIG. 1 is described in more detail. Specifically, FIG. 3 illustrates an apparatus 50 which can be utilized for an electrolytic procedure of the present invention. Apparatus 50 comprises a furnace 52. An anode 54 and cathode 56 are provided within furnace 52. A metal feedstock 58 is provided against anode 54. Metal feedstock 58 can comprise, for example, one or both of titanium or zirconium. In particular embodiments, the metal feedstock can comprise titanium with at least one other metal selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, V, W, Y, Yb and Zr; or can comprise zirconium and at least one other metal selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, Ti, V, W, Y, and Yb. In an exemplary embodiment, titanium is a majority element provided in the feedstock, and in another exemplary embodiment zirconium is a majority element provided in the feedstock.

An electrolyte 60 is provided between the anode and the cathode. The electrolyte can comprise a salt, such as, for example, sodium chloride or magnesium chloride, and can be in a molten form due to a temperature maintained by furnace 52.

Figure 4:
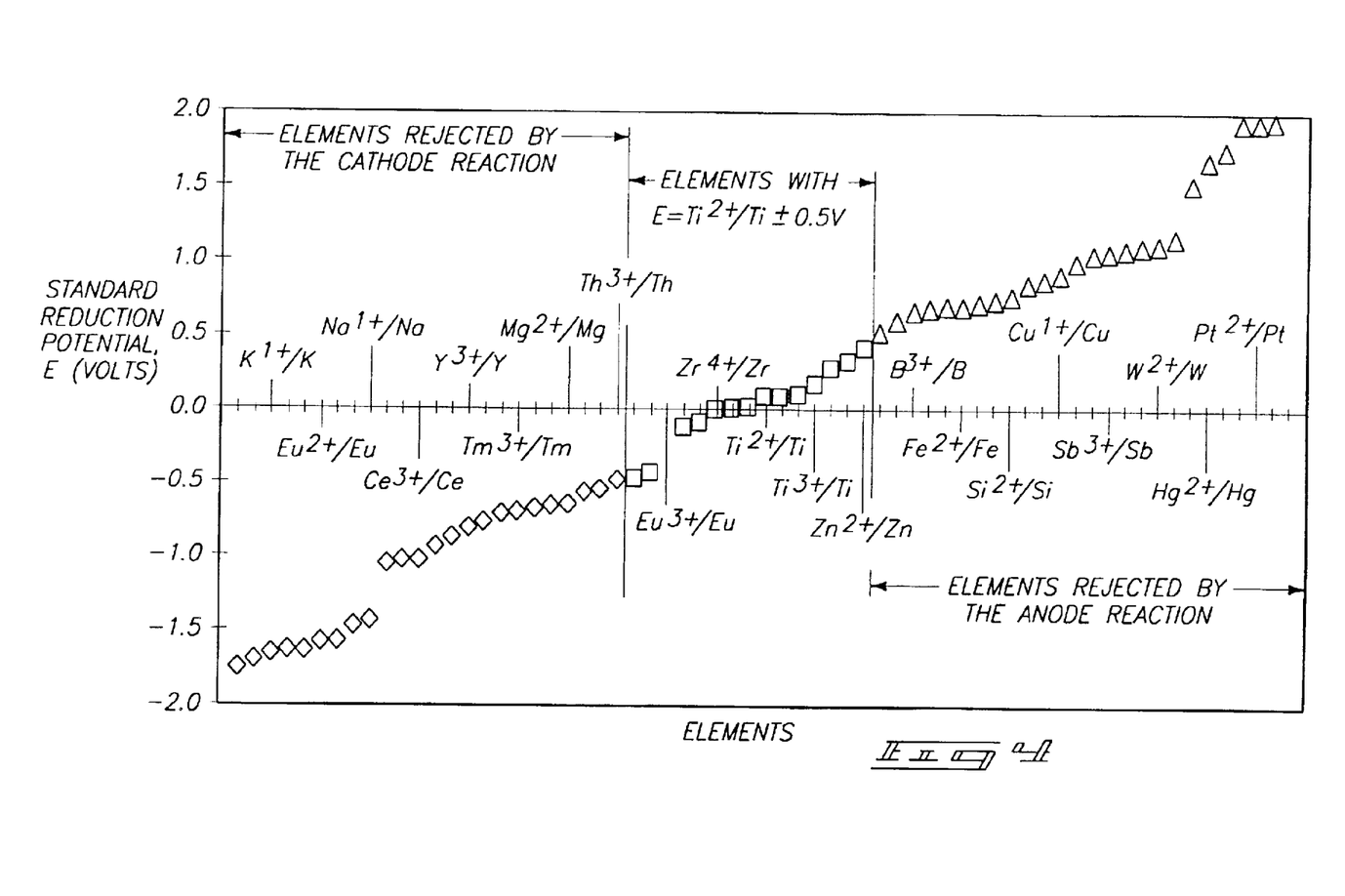
FIG. 4 illustrates a graph showing standard reduction potential for a series of elements, and further showing a window region encompassing elements having a standard reduction potential within ±0.5 volt of the $Ti^{2+}/Ti$ reaction.

In operation, an electrical voltage is provided between anode 54 and cathode 56, and metal is electrolytically transferred from mixture 58 to cathode 56 to form a mixed-metal product 62 at cathode 56. Although mixture 58 is described as being provided against an anode 54, it is to be understood that anode 54 can be considered an electrical interconnection to mixture 58, and that mixture 58 can be considered to effectively be the "anode" during the electrolytic transfer reaction. The composition of mixed-metal product 62 can be determined, in part, by the voltage supplied to apparatus 50. FIG. 4 illustrates a chart of standard reduction potential for reduction of various elements. FIG. 4 also illustrates a window formed within ±0.5 volt of the reduction for $Ti^{2+}/Ti$. Accordingly, if a voltage supplied to apparatus 50 is within ±0.05 volts of the reduction potential for $Ti^{2+}/Ti$, only the elements within the shown window will be formed in the mixed-metal product 62. Accordingly, apparatus 50 can be utilized for purification of a mixed-metal product relative to the material 58 provided at anode 54. The elements having reduction potential within ±0.5 volt of the reduction of $Ti^{2+}/Ti$ include Eu, Zr, Ti, and Zn.

An aspect of the present invention is to form a mixed-metal product at cathode 56. For instance, if a majority element is titanium, then the material at cathode 56 will preferably comprise at least 0.001% of elements other than titanium; and if a majority element is zirconium, then product 62 will preferably comprise at least 0.001% of elements other than zirconium. The amount and type of elements provided at cathode 56 can be determined by the voltage utilized for apparatus 50 and the starting material 58. Specifically, if a voltage window of ±0.7 volts from the reduction potential for conversion of $Ti^{2+}/Ti$ is utilized, a wider number of elements can be incorporated into product 62 than if a voltage window of ±0.5 volts from the reduction potential for conversion of $Ti^{2+}/Ti$ is utilized. Preferably, a voltage window will not exceed more than ±0.7 volts from the reduction potential for a majority element (for example, either titanium or zirconium), to avoid adding excessive impurity to product 62.

Figure 5:
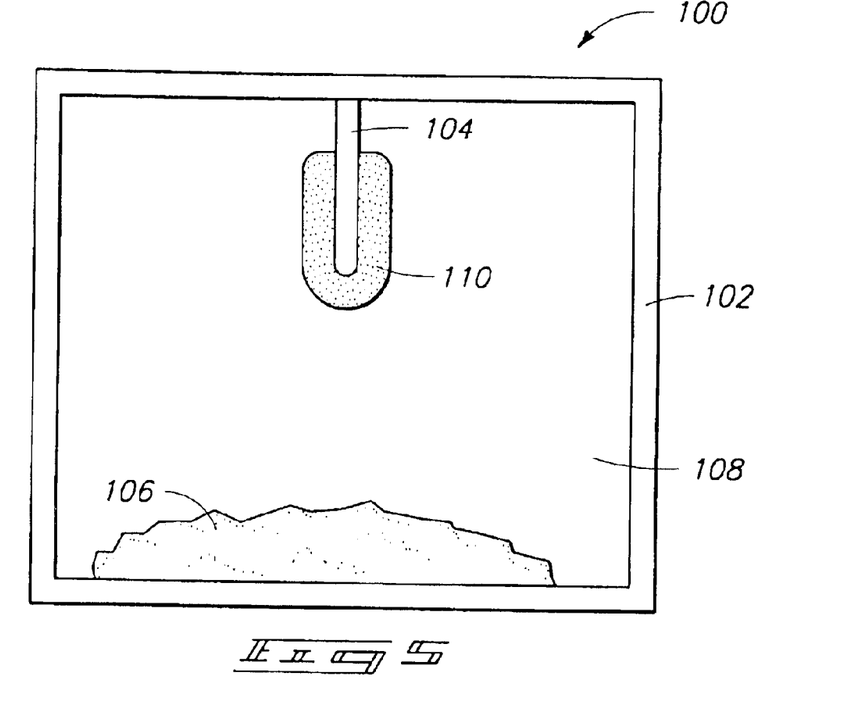
FIG. 5 is a diagrammatic, cross-sectional view of an iodide process encompassed by the present invention.

Referring next to FIG. 5, an iodide process which can be utilized for step 16 of FIG. 1 is diagrammatically illustrated. Specifically, FIG. 5 shows an apparatus 100 comprising a reaction chamber 102. A feedstock 106 is provided within reaction chamber 102, and a heated substrate 104 extends into reaction chamber 102. Feedstock 106 comprises at least 2 different metals, and can, for example, comprise either titanium or zirconium as a majority metal. An iodine gas 108 is provided within reaction chamber 102. In operation, iodine gas 108 transports metal from feedstock 106 to heated substrate 104. The metal is then deposited onto substrate 104 to form a product 110. The transport of a metal from feedstock 106 to heated substrate 104 is described below with reference to reactions (3)–(5), and specifically is described with respect to formation of a titanium metal.

$$Ti(s) + I_2(g) \rightarrow TiI_2(g) \tag{3}$$

$$TiI_2(g) + I_2(g) \rightarrow TiI_4(g) \tag{4}$$

$$TiI_4(g) \rightarrow Ti(s) + 2I_2(g) \tag{5}$$

Accordingly, the titanium is converted to an iodide (specifically, $TiI_4$), and the iodide is subsequently decomposed at the heated substrate 104 to deposit titanium material 110. The reactions described above are merely exemplary reactions, and it is to be understood that the chemistry of metal transport in apparatus 100 can comprise other reactions in addition to, or alternatively to, those described.

A rate of transfer of a material from feedstock 106 to product 110 can depend on, among other things, a temperature differential between feedstock 106 and substrate 104, a concentration of iodine, and kinetics of reaction of a particular metal with iodine to form an iodide, as well as kinetics of reaction of a particular metal iodide to decompose to form the metallic element. Accordingly, if feedstock 106 comprises a mixture of elements, the product 110 can comprise a mixture having a different stoichiometry than that initially present as feedstock 106 due to, for example, differences in kinetics of iodide formation of various metallic iodides, and/or differences in kinetics of iodide decomposition of various metallic iodides.

Feedstock 106 can comprise predominately zirconium, and can further comprise one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, Ti, V, W, Y, and Yb. Alternatively, feedstock 106 can comprise predominately titanium, and can further comprise one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, V, W, Y, Yb and Zr. Also, product 110 can comprise predominately zirconium, and can further comprise one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, Ti, V, W, Y, and Yb. Alternatively, product 110 can comprise predominately titanium, and can further comprise one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, V, W, Y, Yb and Zr.

Figure 6:
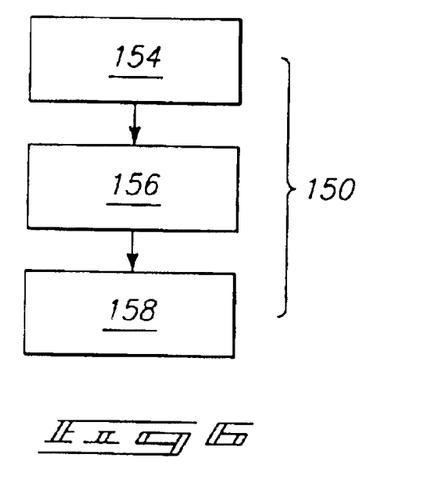
FIG. 6 is a block diagram of a melting and ingot-forming process encompassed by the present invention.

FIG. 6 is a block diagram description of a system which can be utilized for the processing of step 18 of FIG. 1. Specifically. FIG. 6 illustrates a system 150 comprising a feed port 154, a cooled hearth 156, and a mold 158. In operation, a feed material is poured through port 154 and melted by vacuum melting (such as, for example, with an electron beam gun) to form a homogeneous molten mixture of the elements present in the feed material. The molten mixture is subsequently poured into cooled hearth 156, and then flowed into a mold 158. Mold 158 can be in the form of, for example, an ingot can. Accordingly, the material flowed into mold 158 can cool to form an ingot. The ingot will preferably have a homogeneous composition of the elements initially present in the feed material.

The feed material provided to apparatus 150 can be a product of either the reduction process of step 12 of FIG. 1, the electrolysis process of step 14 of FIG. 1, or the iodide process of step 16 of FIG. 1. Regardless, the feedstock will preferably comprise a mixture of metals, such as, for example, a titanium-based material having at least 0.001% of non-titanium metals; or a zirconium-based material having at least 0.001% of non-zirconium metals. If the feed material is titanium-based, the non-titanium metal content of the ingot can be in a range of from 0.001% to 50%, such as, for example, a range of from 0.001% to 10%. The non-titanium content can be, for example, at least 0.01%, and in particular embodiments can be at least 0.1%. Alternatively, if the material formed in the ingot is zirconium-based, the non-zirconium metal content can be in the range of from 0.001% to 50%, such as, for example, from 0.001% to 10%. Further, the non-zirconium content can be at least 0.01%, and in particular embodiments can be at least 0.1%.

A cooled ingot formed by the process of FIG. 6 can be utilized for forming a sputtering target. Sputtering targets comprising a homogeneous mixture of metallic elements can be particularly useful in sputtering processes in which it is desired to form a titanium-based or zirconium-based barrier layer for preventing copper diffusion.

If the barrier layer is to be a titanium-based material, such barrier layer can be formed by sputter-deposition from a target comprising, for example, titanium in combination with one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, V, W, Y, Yb and Zr. It is noted that many of the elements utilized in a sputtering target of the present invention are elements which are typically precluded from titanium-based sputtering targets of the prior art. Accordingly, there has not been a process developed in the prior art for forming a homogeneous mixture of titanium with one or more of the listed elements. However, for sputtering applications of the present invention it can be desired that a target comprise a homogeneous mixture throughout of all of the elements present in the sputtering target. Methodology of the present invention can enable such homogeneous mixture to be formed. Specifically, since methodology of the present invention melts a mixed-metal feedstock, methodology of the present invention can form a homogeneous mixed-metal ingot which can in turn be utilized to form a sputtering target with a homogeneous mixed-metal composition throughout.

If the barrier layer is to be a zirconium-based material, such barrier layer can be formed by sputter-deposition from a target comprising, for example, zirconium in combination with one or more elements selected from the group consisting of Al, B, Ba, Be, Ca, Ce, Co, Cs, Dy, Er, Fe, Gd, Hf, Ho, La, Mg, Mn, Mo, Nb, Nd, Ni, Pr, Sc, Sm, Sr, Ta, Ti, V, W, Y, and Yb. The zirconium can be present in the sputtering target to exemplary concentrations of at least 55%, at least 70%, at least 90%, at least 94%, or at least 97%. In particular applications, the amount of non-zirconium metals can be provided to a sufficient concentration within the sputtering target that the zirconium is present to less than 99% or less than 98%, while still being a majority element of the target. Accordingly, the target can comprise, for example, a concentration of zirconium in a range of from about 50% to about 98%, or can comprise a range of zirconium of from about 50% to about 99%. Further, the sputtering target can consist essentially of, or consist of, zirconium and titanium.

Zirconium-based sputtering targets of the type described herein can have properties similar to those of titanium-based sputtering targets, and accordingly can be used for forming diffusion barriers to impede or prevent copper diffusion from copper-containing materials to other components associated with semiconductor substrates. There has not been a process developed in the prior art for forming a sputtering target consisting of a homogeneous mixture of zirconium with one or more of the listed elements, but methodology of the present invention can enable such homogeneous mixture to be formed. Specifically, since methodology of the present invention melts a mixed-metal feedstock, methodology of the present invention can form a homogeneous mixed-metal zirconium-based ingot which can in turn be utilized to form a sputtering target with a homogeneous zirconium-based mixed-metal composition throughout.

If the barrier layer is to be a titanium-based material, such barrier layer can be formed by sputter-deposition from a target comprising, consisting essentially of, or consisting of titanium and boron. The titanium can be present in the sputtering target to exemplary concentrations of at least 70%, at least 90%, at least 94%, or at least 97%. In particular applications, the amount of boron can be provided to a sufficient concentration within the sputtering target that the boron is present to greater than 5 ppm in a target pure to 5N5, greater 50 ppm in a target pure to 4N5, greater than 500 ppm in a target pure to 3N5, or greater than one part per thousand in a target pure to 3N. Titanium/boron mixed-metal sputtering targets can be used for forming diffusion barriers to impede or prevent copper diffusion from copper-containing materials to other components associated with semiconductor substrates. There has not been a process developed in the prior art for forming a sputtering target consisting of a homogeneous mixture of titanium with boron, but methodology of the present invention can enable such homogeneous mixture to be formed. Specifically, since methodology of the present invention melts a mixed-metal feedstock, methodology of the present invention can form a homogeneous mixed-metal titanium/boron ingot which can in turn be utilized to form a sputtering target with a homogeneous titanium and boron mixed-metal composition throughout.

What is claimed is:

1. A sputtering target comprising at least 90% Zr and one or more elements selected from the group consisting of Ba, Be, Ca, Ce, Co, Cs, Dy, Er, Fe, Gd, Ho, La, Mn, Mo, Nd, Pr, Sc, Sm, Sr, V, W, and Yb.

2. The sputtering target of claim 1 wherein the Zr concentration within the target is at least 94%.

3. The sputtering target of claim 1 wherein the Zr concentration within the target is at least 97%.

4. The sputtering target of claim 1 the Zr concentration within the target is less than 98%.

5. The sputtering target of claim 1 wherein the total non-zirconium metal content of the target is in a range of 0.001% to 10% of the target.

6. The sputtering target of claim 1 wherein the total non-zirconium metal content of the target is at least 0.01% of the target.

7. The sputtering target of claim 1 wherein the total non-zirconium metal content of the target is at least 0.1% of the target.

8. The sputtering target of claim 1 wherein the total non-zirconium metal content of the target is at least 1% of the target.

9. The sputtering target of claim 1 wherein the total non-zirconium metal content of the target is at least 2% of the target.

10. A sputtering target comprising Zr and one or more elements selected from the group consisting of Ba, Be, Ca, Ce, Co, Cs, Dy, Er, Fe, Gd, Ho, La, Mn, Mo, Nd, Pr, Sc, Sm, Sr, V, W, and Yb; the Zr being the majority element of the target; and further comprising one or more elements selected from the group consisting of Mg, Al, B, Hf, Nb, Ni, Ta, Y and Ti.

11. A sputtering target comprising at least 97% Ti and greater than 2% B, by weight.

* * * * *